United States Patent [19]

Reynolds

[11] Patent Number: 4,646,248
[45] Date of Patent: Feb. 24, 1987

[54] INSULATION ANALYZER APPARATUS AND METHOD OF USE

[75] Inventor: Peter H. Reynolds, Ambler, Pa.
[73] Assignee: James G. Biddle Company, Blue Bell, Pa.
[21] Appl. No.: 527,551
[22] PCT Filed: Dec. 14, 1981
[86] PCT No.: PCT/US81/01647
 § 371 Date: Jul. 28, 1983
 § 102(e) Date: Jul. 28, 1983
[87] PCT Pub. No.: WO83/02162
 PCT Pub. Date: Jun. 23, 1983
[51] Int. Cl.⁴ .................... G01R 19/00; G01R 31/12
[52] U.S. Cl. .................................. 364/483; 324/54; 364/550
[58] Field of Search ............... 364/480–483, 364/550; 324/54; 340/660

[56] References Cited

U.S. PATENT DOCUMENTS

Re. 30,692 7/1981 Ellson ........................... 364/482 X
4,117,397 9/1978 Fukao et al. ...................... 324/54
4,214,311 7/1980 Nakashima et al. ................ 364/482

OTHER PUBLICATIONS

E. B. Curdts, "Insulation Testing by D-C Methods" 1958, reprinted in 1964 in Biddle Technical Publication 22T1.

Primary Examiner—Errol A. Krass
Assistant Examiner—Kevin J. Teska
Attorney, Agent, or Firm—Dann, Dorfman, Herrell & Skillman

[57] ABSTRACT

An insulation specimen may be analyzed by removing any absorbed charge from the specimen. Test voltage E is applied through system resistance R. $I_{TOT}$ is sensed at time intervals occurring at selected times multiplied by any three points in a power series while maintaining E constant and $R_{IR}$ is calculated from the formula:

$$R_{IR} = \frac{E}{i_c} - R$$

and displayed. Apparatus consists of a high voltage power supply, current sensing means and specimen terminals for connecting an insulating specimen across the power supply in series with the current sensing means. A voltage comparator is connected across the specimen terminals to sense effective voltage across the specimen. Computation means receives inputs from timing means, the current sensing means and the voltage comparator and is used to calculate insulating current using a formula involving elapsed time measurements of total current through the insulation specimen to calculate insulation current and the insulation resistance of the insulation specimens. Means is employed to adjust the high voltage direct current power supply and display means permits display of insulation current and insulation resistance readings.

8 Claims, 3 Drawing Figures

INSULATION ANALYZER APPARATUS AND METHOD OF USE

The present invention relates to measurement of insulation resistance, and other related properties, of a specimen using a method and preferably employing a novel insulation analyzer apparatus in accordance with the present invention.

BACKGROUND OF THE INVENTION

Since close to the beginning of the century, insulation measurements have been made using techniques which have been highly developed and instruments built specifically for that purpose such as the Megger ® sold by James G. Biddle Company. Such instrumentation requires a high degree of knowledge and skill on the part of the operator in order to obtain readings which are reliable and, by following a painstaking procedure, can achieve a high degree of accuracy in measuring insulation resistance. Persons with the skill and patience to practice this method are becoming relatively unavailable.

In 1958, E. B. Curdts made a technical analysis of insulation testing entitled "Insulation Testing By D-C Methods" which he revised and reprinted in 1964 in Biddle Technical Publication 22T1. In that publication, Curdts showed that when d.c. voltage is applied, the current existing in the insulation of a capacitive specimen is always made up of three components, to wit: geometric capacitance current, $i_g$; absorption current, $i_a$; conduction or leakage current, $i_z$. These currents will be explained more fully hereafter, but it will be understood that the current which was measured by all conventional insulation testers was $i_{TOT}$, where $i_{TOT} = i_g + i_a + i_c$.

Because the $i_{TOT}$ is measured by all conventional insulation testers, various elaborate techniques have been evolved to estimate the value of $i_c$ in the presence of $i_g$ and $i_a$. Typical examples are time-resistance tests, step-voltage tests, polarization index and dielectric absorption ratio tests. These tests have been developed to a considerable degree of sophistication and achieve excellent results when applied by skilled technicians. However, they suffer from the disadvantages of taking comparatively long periods of time and requiring great care and skill in the measurements and their interpretation.

In 22T1, previously referenced E. B. Curdts has described a method of calculating $i_c$. He shows that since the absorption current is a power function of time, constant n (with a value between 0 and 1.0) is the slope of the straight-line current-time curve plotted on a log-log basis.

The leakage current $i_c$ will represent a deviation from this curve, and may be calculated from $$i_c = \frac{i_1 \times i_{10} - (i_{3.16})^2}{i_1 + i_{10} - (2 \times i_{3.16})}$$

where $i_1$, $i_{3.16}$ and $i_{10}$ are three values of $i_{TOT}$ measured at different times, based on a constant unit of time multiplied by their subscripts, i.e., 1, 3.16 and 10 minutes.

This relationship is true provided that:

a. $i_g$ has fallen to a negligible value compared to $i_a$ and $i_c$; which therefore also assumes that b. $i_g$ is negligible at that voltage level when compared to $i_a$ and $i_c$.

NATURE OF THE PRESENT INVENTION

The present invention involves apparatus for automatically accomplishing these tests. In particular, the present invention employs an insulation analyzer apparatus which employs a high voltage direct current power supply. Current sensing means is employed and specimen terminals are provided for connecting the insulation specimen across the power supply in series with the current sensing means. A voltage comparator is connected across the specimen terminals to sense effective voltage across the specimen. Timing means is provided. Computation means for recovering input from the timing means, current sensing means and voltage comparator in calculating insulation current as a function of elapsed time measurements of total current through the insulation specimen to calculate insulation current, and the insulation resistance of the specimen's insulation. Means are provided to adjust the high voltage direct current power supply. Display means are also provided permitting reading of various insulation and other properties of the specimen.

In accordance with the present invention, the following method of analyzing an insulation specimen is provided which may be practiced using the analyzer apparatus. First, remove any absorbed charge from the specimen. Next, apply test voltage E through a fixed resistance, R, in series with E. Then, time the interval from V=0 until V=0.632E across the specimen with capacitance C. As is well known, this is equal to one time constant for a combination of resistance and capacitance arranged as shown. Next, using formula $t = C \times R$, where t is time in seconds, calculate C and store result. Next, as an optional step, calculate and display the value of 100CR, start timing and count display from 100CR to zero. In the course of this countdown, maintain E constant and measure $i_{TOT}$ in time increments related in the sequence ($t_1$, $t_2$, $t_3$) 1, 3.16, 10, for example at 10CR, 31.6CR and 100CR. Calculate time insulation resistance ($R_{IR}$) from $$i_c = \frac{i_{t1} \times i_{t3} - i_{t2}^2}{i_{t1} + i_{t3} - 2i_{t2}}$$

and that is where $$R_{IR} = \frac{E}{i_c} - R$$

For a better understanding of the present invention, reference is made to the drawings in which.

Figure 1:
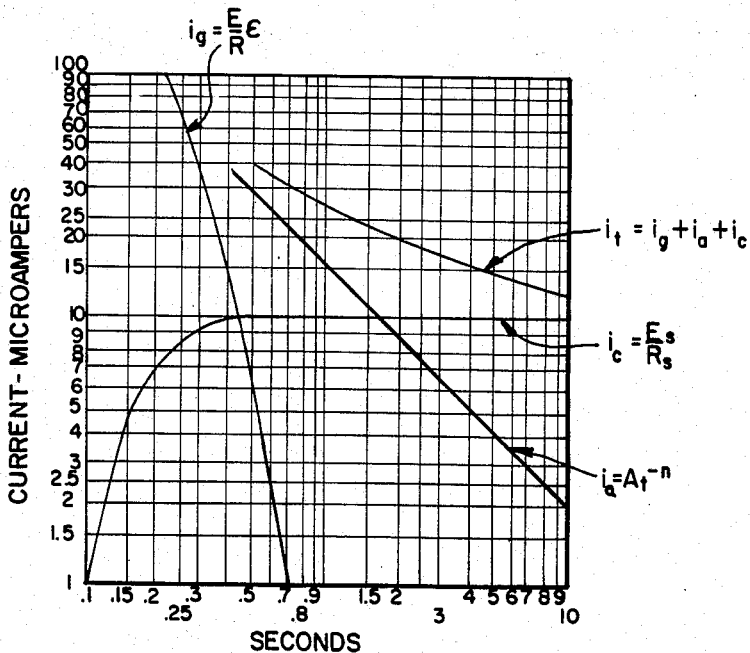
FIG. 1 is a plot of current in microamperes against time in seconds of $i_g$, $i_a$, $i_c$ and the total of these three currents.

Referring to FIG. 1, plots of the four currents are shown. These currents may be described as follows:

Geometric Capacitance Current, $i_g$

This is the current due to the capacitance created by the geometric arrangement of electrodes and the dielectric constant(s) of the insulation(s).

$$i_g = \frac{E}{R}(\epsilon)^{\frac{-t}{CR}}$$

Where
E=open circuit voltage of the dc supply;
R=the total internal series resistance;
t=time; and
C=capacitance of the specimen.

Absorption Current, $i_a$

This current results from absorption within the imperfect dielectric, caused by polarizations within the molecular chains of the dielectric.

$$i_a = \Delta VCDt^{-n} = At^{-n}$$

where
V=the increment of applied voltage
C=capacitance of the specimen
D=a proportionality factor on a per unit basis of applied voltage and the capacitance of the specimen. This depends on the type of insulation and its condition and temperature.
A=$\Delta VCD$
n=a constant
t=time Conduction or Leakage Current, $i_c$ This current is the resistive current either through the bulk of the insulation or over surfaces such as terminal insulator.

$$i_c = \frac{E_s}{R_s}$$

where
$E_s$=the applied direct voltage (at the terminals of the specimen)
$R_s$=the insulation resistance of the specimen under test.

Partial Discharge Current, $i_q$

As shown by R. J. Densley in ASTM-STP 660 Chapter 11, an additional component will occur when the value of $E_s$ is above the partial discharge inception voltage for the specimen.

$$i_q = \sum_{i=1}^{i=n} f_i q_i$$

where $f_i$=discharge repetition rate of the discharges of magnitude, qi, occurring at a discharge site, i. For most purposes $i_q$, the partial discharge current can be ignored and the plot $i_t$ is equivalent to $i_{TOT}$. It should be noted that FIG. 1 is plotted on logarithmic scales.

Figure 2:
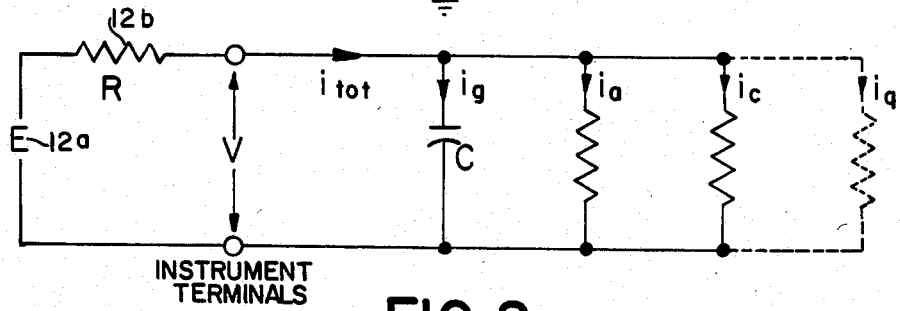
FIG. 2 is a equivalent circuit representing the insulation specimen broken down into the respective current paths for the three current components, a possible additional current $i_q$, defined below, and showing the power supply and system resistance.

Referring to FIG. 2, the currents may be visualized as dividing through the specimen. As shown, $i_q$ is treated as negligible for most purposes and in most cases this is acceptable. In test instrument terms, a typical workable range would be to provide a test supply E with an internal series resistance of 1M Ω. The capacitive load C of the specimen might range from 10 pF minimum to 10 μF maximum. Thus, ignoring the effect of insulation resistance, the system provides a range of time constants from RC=$10^{-5}$ seconds minimum to 10 seconds maximum. These assumptions are illustrative and are not critical to the operation of the instrument but permit practical values to be used with the final specifications of an instrument designed in each individual case based upon need.

The method of the present invention in its simple mode of operation can be specified in the following steps:

Step 1. Conditioning of the specimen. Remove any absorbed charge remaining by one of three methods: apply reverse dc, reducing in amplitude to zero; or apply ac reducing to zero; or short circuit the specimen for a significant time. The first two methods are obviously more desirable because the time involved is shorter.

Step 2. Apply the test voltage E via R. Measure the time interval from 0 until—

$$V = 0.632E$$

This time interval gives—

$$t \text{ (secs)} = C \times R \text{ ($C$ in } \mu\text{F, } R \text{ in m}\Omega)$$

Calculate C, store in memory CR and C.

Step 3. Start Timing. Calculate and display 100CR. Count display down to zero (test finished).

Step 4. Maintaining E constant, measure $i_{TOT}$ in time increments related in the sequence ($t_1$, $t_2$, $t_3$) 1, 3.16, 10, for example 10CR, 31.6CR and 100CR. Calculate true Insulation Resistance ($R_{IR}$) from $$i_c = \frac{i_{t1} \times i_{t3} - i_{t2}^2}{i_{t1} + i_{t3} - 2i_{t2}}$$

and that is where $$R_{IR} = \frac{E}{i_c} - R$$

where R is the resistance 12b shown in FIG. 2.

Step 5. Display and/or print E, $R_{IR}$, C, or any other form that can be calculated from these values, e.g., zero frequency power factor, tan δ, etc. It is also possible to calculate the slope n of the absorption current $i_a$, which may be of interest with some types of insulation.

Operation in a complex mode of operation is also possible wherein measurements in the simple mode are repeated at a voltage E, selected to be below partial discharge inception, and the results stored. The voltage is then increased in steps and the value of the $R_{IR}$ at each voltage compared with the previous value. The point where a decrease is detected corresponds to the partial discharge inception. At the conclusion of the test the instrument can read out: C, $R_{IR}$, partial discharge inception, partial discharge at a predetermined voltage. The calculation of partial discharge magnitude is based on measuring $\Delta i_c$, since $\Delta i_c$ (representing partial discharge) is based on one coulomb/sec=1 ampere (by definition). The method of detection of $i_c$ requires the use of techniques already developed in conventional partial discharge measurement, for example, the James G. Biddle Co. Catalog 665700-00 partial discharge bridge.

DISCUSSION OF THE MEASUREMENT

Most measurements would be of such a short duration that the delay would be negligible. For example, with a 0.1 μF capacitive specimen, a total measurement time of about 10 secs. is required for the simple mode and for a full analysis of 10 voltage steps, only 1 min. 40 sec. The worst case would be a 10 μF specimen where a time of 16.6 minutes is required for a simple measurement. This is probably acceptable, because the test implies a very unusual measurement such as the largest size of generator or a very long length of cable. No operator intervention would be required during the test.

It is quite simple to reduce the timing, either by reducing the initial reading from 10CR to say 5CR (at some loss of accuracy) or by reducing R. In the case of portable field apparatus, the value of R should also be selected to permit measurements at a current of less than 5 mA for reasons of safety.

A number of variations of the basic concept are possible.

a. Instead of a constant voltage source for E, it could be replaced by a constant current generator. This somewhat modifies the calculations but otherwise does not change the concept. The decision therefore depends on practical and economic considerations.

b. If the initial value of CR is too short for accurate timing with a practical microprocessor clock rate (say 4 MHz) it may be desirable to go back to step 1 and repeat the sequence with the higher value of R. Similarly, if CR is very large, measurements could be automatically changed to 50CR total for shorter times at slightly reduced accuracies.

c. If high precision in the measurement of C is required, the initial calculation which ignores the effect of $R_{IR}$ can be recalculated taking $R_{IR}$ into account. (Note that the inaccuracy of the initial determination of CR will not affect the value of $R_{IR}$ since it is only a proportional error.)

d. In the presence of noise it may be advantageous to automatically perform iterative measurements and average the result.

DESCRIPTION OF THE MEASUREMENT APPARATUS

Figure 3:
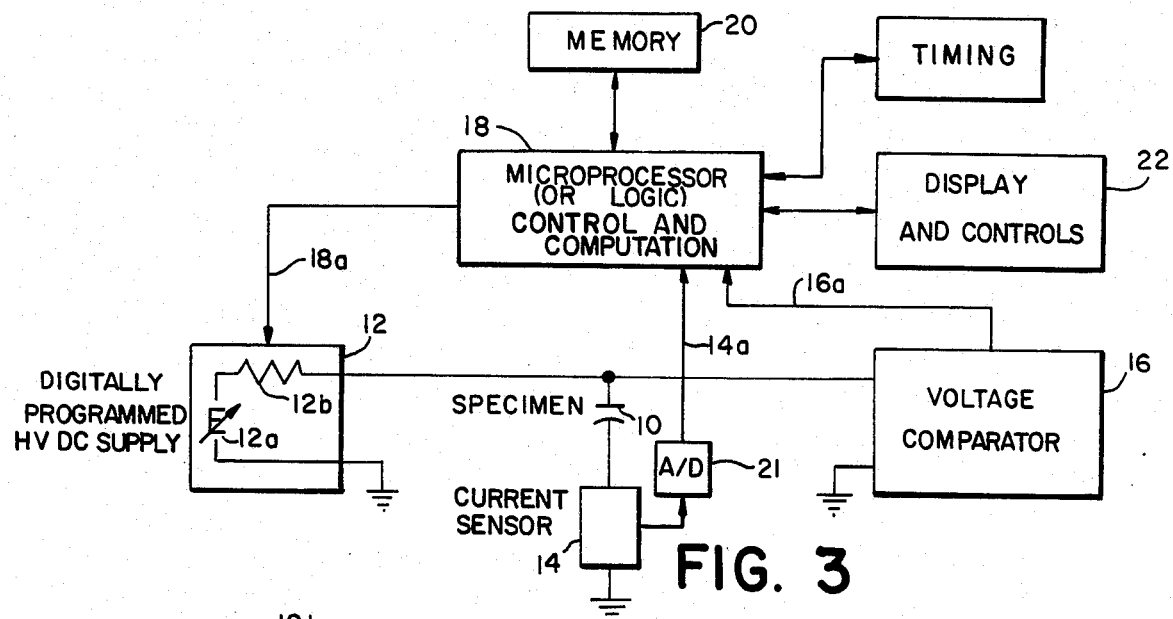
FIG. 3 is a block diagram of an insulation analyzer in accordance with the present invention.

Reference is now made to FIG. 3 which illustrates the insulation analyzer system in schematic form. Typical embodiments of the instrument are a field portable lightweight instrument with a 5 kV 5 mA maximum supply for use in the simple mode only. A more elaborate transportable unit for complex mode of operation may be rated at 30 kV 30 mA.

The system consists of a programmable regulated high voltage d.c. power supply 12 made up of a regulated adjustable voltage source 12a in series with a resistor 12b. The voltage of the power supply is regulated to a close tolerance by an internal feedback loop. The voltage loop is set by reference voltage controlled by a digital signal originating from the microprocessor via connection 18a.

A specimen 10, which is to be measured to determine its insulation characteristics and capacitance, is connected across the power supply 12 and in series with the current sensor 14. The current sensor is typically a precision resistor with a value which is small compared with resistance 12b.

An electronic voltage comparator 16 is connected in parallel with the specimen 10 and the current sensor 14. This compares the voltage across the specimen 10 and current sensor 14 with a reference voltage. When the voltage reaches 0.632E (where E is the present value in 12a), a digital signal is transmitted by connection 16a to the microprocess 18.

The output of the current sensor 14, in the form of an analog voltage directly proportional to the sensed current ($I_{TOT}$ in FIG. 2), is connected to an analog-to-digital converter 21. The output of this converter, in digital form, is connected to the microprocessor 18 by connection 14a.

The microprocessor system 18 and associated memory 20 perform the control, computation and timing function necessary to the measurement. Stored in the read-only portion of the memory 20 is a program which executes the actions listed as steps 1 through step 5 in the preceeding description.

The microprocessor 18 and associated integrated circuits and read only and random access memories can be any of a wide range of currently available microprocessor equipment, such as the Radio Corporation of America's COSMAC Microprocessor Type 1802 Handbook MPG 180C "COSMAC Microprocessor Product Guide". A second example is the Zilog Z80 series of microprocessor described in the books "Z80 Microprocessor Programming and Interfacing", books 1 and 2 by E. A. Nichols, J. C. Nichols and P. R. Rony and the companion book "Microcomputer-Analog Converter Software and Hardware Interfacing" by J. A. Titus, C. A. Titus, P. R. Rony, D. G. Larsen, all published by Howard W. Sams & Co., Inc., Indianapolis, IN. The general principles used are similar to those described in "Microcomputers/Microprocessors: Hardware, Software and Applications". J. R. Hilborn, P. M. Tulich, published by Prentice-Hall Inc., Englewood Clifts, NJ.

The program to implement steps 1 through 5 given above can be in any form suitable for the microprocessor used.

Alternatives to the use of the microprocessor 18 described above would be a system of hard wired logic or a method of analog measurement with suitable timing means and a recorder, both of which could be made to achieve the same results by implementing the program Steps 1 through 5 in the previous description.

The new instrument has the primary advantage that it can measure with a single set-up, requiring no special operator skill, the quantity which gives a true indication of insulation quality. At present the same information can only be obtained by a complex and time consuming series of measurements.

The new instrument also provides a means of measuring loss due to partial discharge and establishing partial discharge inception.

These advantages can be obtained with an instrument which is smaller, lighter and costs less than existing techniques.

I claim:

1. Insulation analyzer apparatus comprising:
    a programmable high voltage direct current power supply,
    current sensing means,
    specimen terminals for connecting an insulation specimen across said power supply in series with the current sensing means,
    a voltage comparator connected across the specimen terminals to sense effective voltage across the specimen,
    timing means,
    computation means for receiving inputs from the timing means, current sensing means and voltage comparator and calculating insulation current using a formula involving elapsed time measurements of total current through the insulation specimen to calculate insulation current and the insulation resistance of the insulation specimens;
means to adjust the high voltage direct current power supply; and
display means permitting insulation current and insulation resistance readings.

2. The insulation analyzer apparatus of claim 1 in which the computation means is a programmable computer.

3. The insulation analyzer apparatus of claim 1 in which test voltage E is held constant in the high voltage direct current power supply.

4. The insulation analyzer apparatus of claim 1 in which the output current of the high voltage direct current power supply is held constant.

5. The insulation analyzer apparatus of claim 1 in which the timing means is set for a predetermined period, and the computation means has preestablished criteria for adequacy of the timing period results, whereby if the initial values of the product of total specimen resistance and capacitance is too small for convenience in use, the scale is automatically changed by adding a known amount of resistance to the specimen resistance.

6. The insulation analyzer apparatus of claim 1 in which the timing means is set for a predetermined period, and the computation means has preestablished criteria for adequacy of the timing period results, whereby if the initial values of the product of total specimen resistance and capacitance is too large for convenience in use, the scale is automatically changed by modifying the amount of resistance added to the specimen resistance.

7. A method of analyzing an insulation specimen comprising:
removing any absorbed charge from the specimen;
applying test voltage E through system resistance R;
sensing $I_{TOT}$ at three preselected time $t_1$, $t_2$ and $t_3$, while maintaining E constant;
calculating and displaying insulation resistance $R_{IR}$ from formula:

$$R_{IR} = \frac{E}{i_c} - R$$

where $$i_c = \frac{i_{t1} \times i_{t3} - i_{t2}^2}{i_{t1} + i_{t3} - 2i_{t2}}$$

and where $t_3 = 10t_1$; $t_2 = 3.16t_1$ and $t_1 =$ any unit of time arbitarily chosen; and
repeating the steps making repetitive measurements and averaging the results in order to reduce the effect of electrical noise.

8. A method of analyzing an insulation specimen comprising:
removing any absorbed charge from the specimen;
applying test voltage E through system resistance R;
timing an interval t until the specimen reaches 0.632E; then calculating C from $C = t/R$;
displaying value of C;
starting timing and counting display from 100CR and decrementing by 1CR steps to zero;
maintaining E constant, while measuring $I_{TOT}$ at each of the timing intervals at 100CR, 31.6CR and 10CR; and
calculating and displaying resistance $R_{IR}$ from formula:

$$R_{IR} = \frac{E}{i_c} - R$$

where $$i_c = \frac{i_{t1} \times i_{t3} - i_{t2}^2}{i_{t1} + i_{t3} - 2i_{t2}}.$$

* * * * *